(12) United States Patent
Chen et al.

(10) Patent No.: US 12,431,436 B2
(45) Date of Patent: Sep. 30, 2025

(54) DISPLAY PANEL

(71) Applicant: AUO Corporation, Hsinchu (TW)

(72) Inventors: Rwei Shan Chen, Hsinchu (TW);
Shu-Hao Huang, Hsinchu (TW);
Sung-Yu Su, Hsinchu (TW)

(73) Assignee: AUO Corporation, Hsinchu (TW)

( * ) Notice: Subject to any disclaimer, the term of this patent is extended or adjusted under 35 U.S.C. 154(b) by 416 days.

(21) Appl. No.: 18/082,548

(22) Filed: Dec. 15, 2022

(65) Prior Publication Data
US 2024/0030153 A1    Jan. 25, 2024

(30) Foreign Application Priority Data

Jul. 21, 2022   (TW) .................................. 111127293

(51) Int. Cl.
*H01L 23/544* (2006.01)
*H05K 5/02* (2006.01)
*H10D 30/67* (2025.01)

(52) U.S. Cl.
CPC ....... *H01L 23/544* (2013.01); *H10D 30/6723* (2025.01); *H10D 30/6733* (2025.01); *H01L 2223/544* (2013.01); *H05K 5/02* (2013.01)

(58) Field of Classification Search
CPC ............. H01L 23/544; H01L 2223/544; H01L 2223/54426; H01L 2223/54486; H10D 30/6723; H10D 30/6733; H10D 30/6734; H10D 86/441; H10D 86/60; H05K 5/02; G09F 9/3026; G09F 9/33; G09F 9/335; H10H 29/142

See application file for complete search history.

(56) References Cited

U.S. PATENT DOCUMENTS

2017/0301843 A1*  10/2017  Kim ..................... H10K 59/179

FOREIGN PATENT DOCUMENTS

| CN | 103472614 | 12/2013 |
| CN | 107167951 | 9/2017 |
| CN | 114171499 | 3/2022 |

\* cited by examiner

*Primary Examiner* — Mohammad A Rahman
(74) *Attorney, Agent, or Firm* — JCIPRNET

(57) ABSTRACT

A display panel includes a substrate, a mark structure, a plurality of active elements, and a plurality of light emitting elements. The mark structure is disposed in a mark region of the display panel. The mark structure includes a drilled layer having a plurality of through holes. The active elements are disposed in an active element region of the display panel. Both the mark region and the active element region are located in a display region of the display panel. The light emitting elements are disposed in the display region of the display panel. A first portion in the light emitting elements is overlapped with the mark structure in a normal direction of a surface of the substrate.

10 Claims, 15 Drawing Sheets

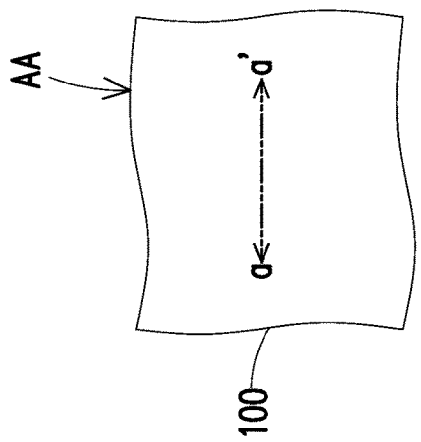
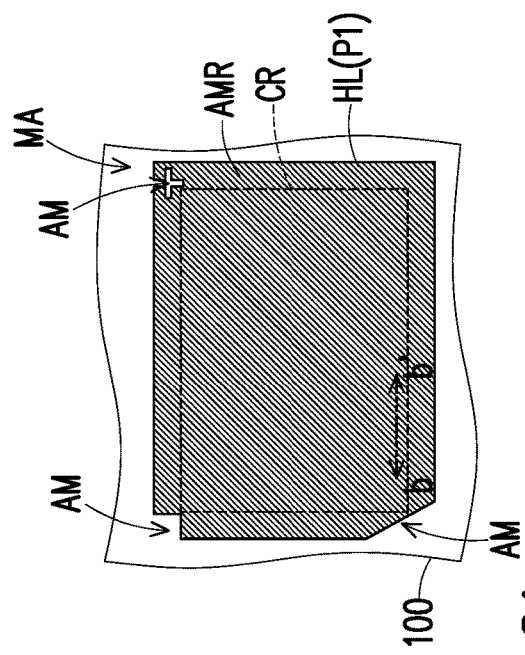
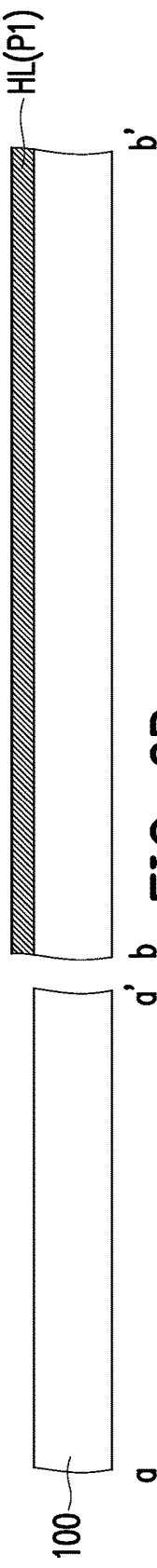
FIG. 2A
FIG. 2B

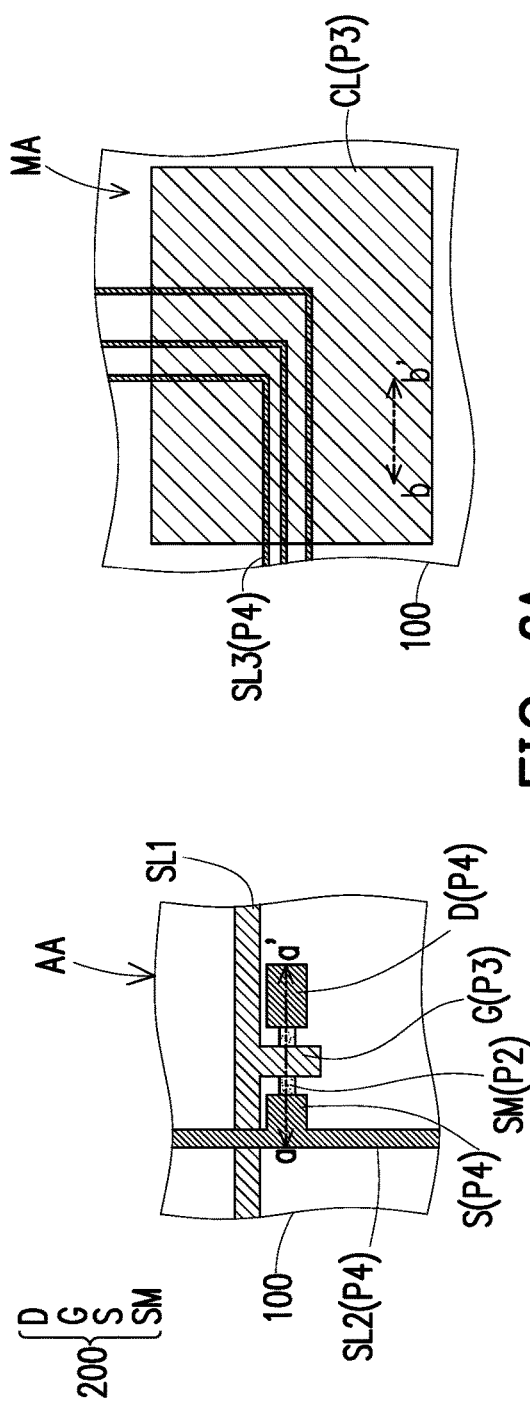
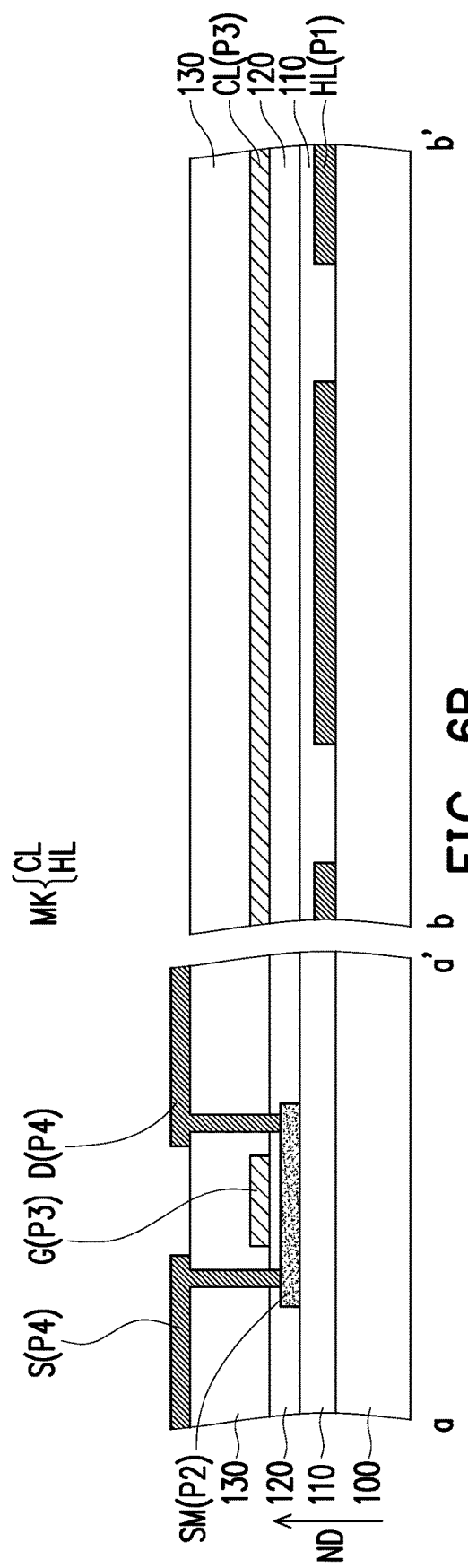
FIG. 6A
FIG. 6B

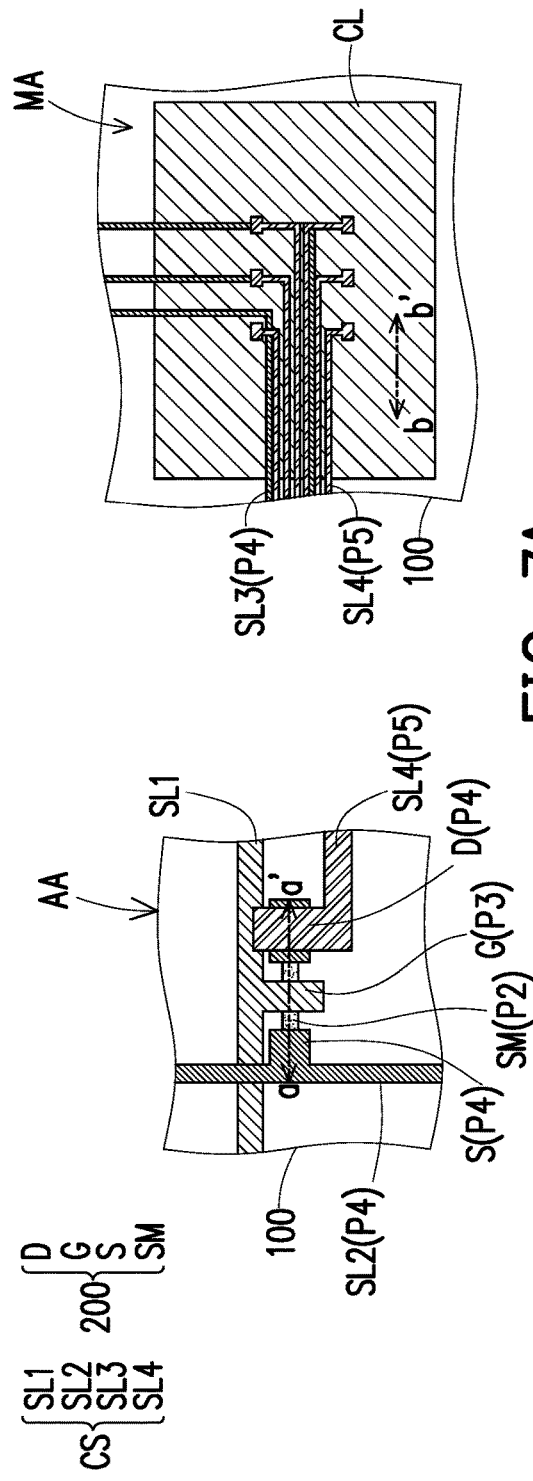
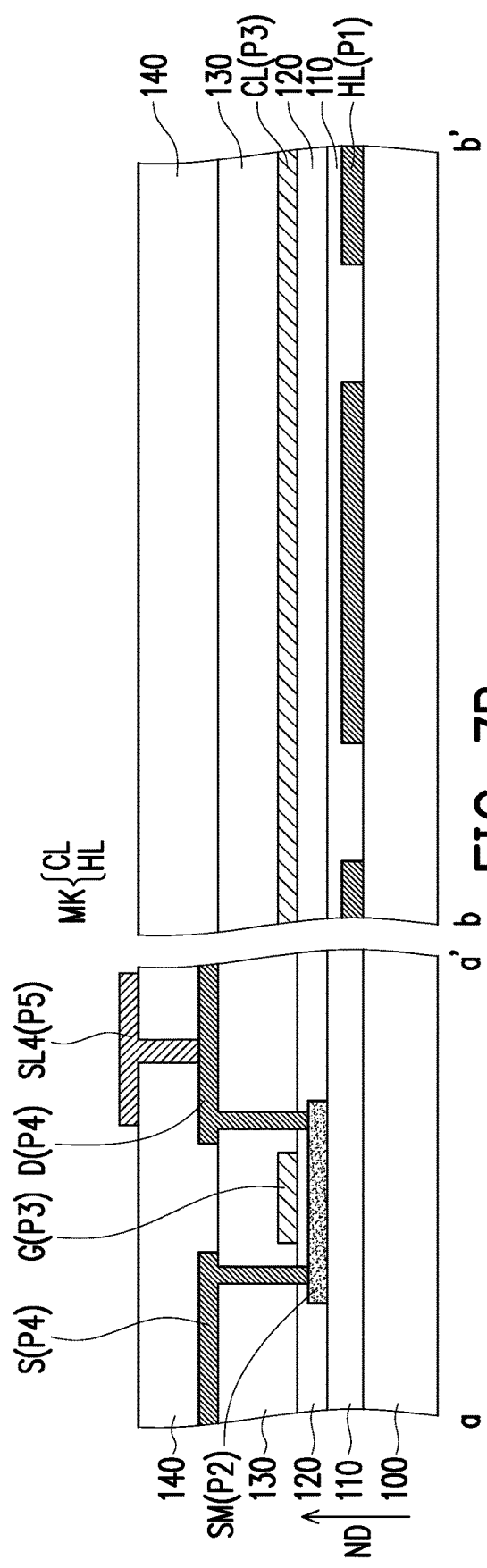
FIG. 7A
FIG. 7B

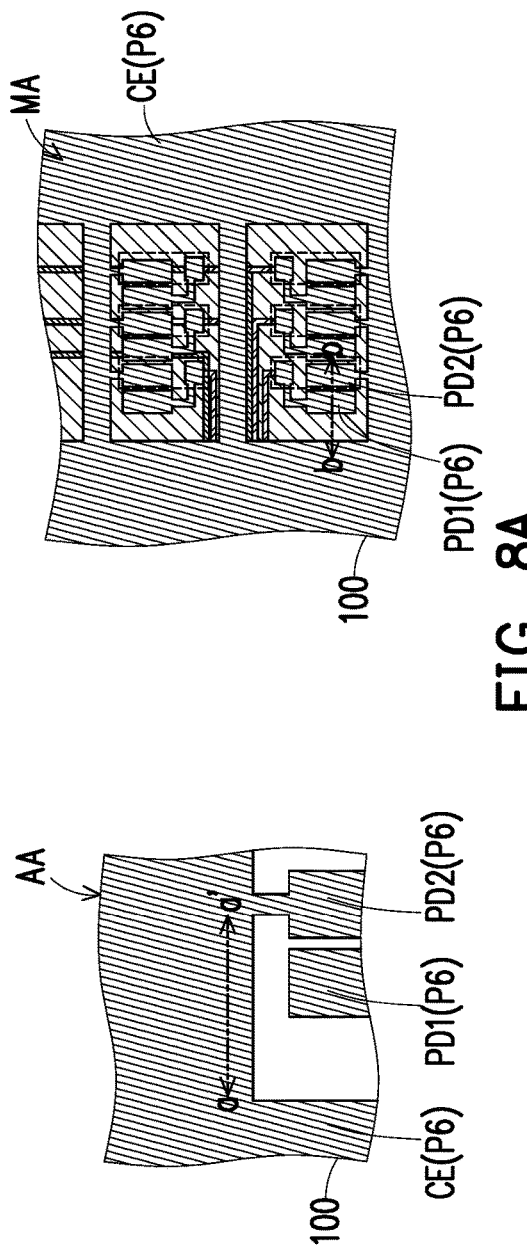
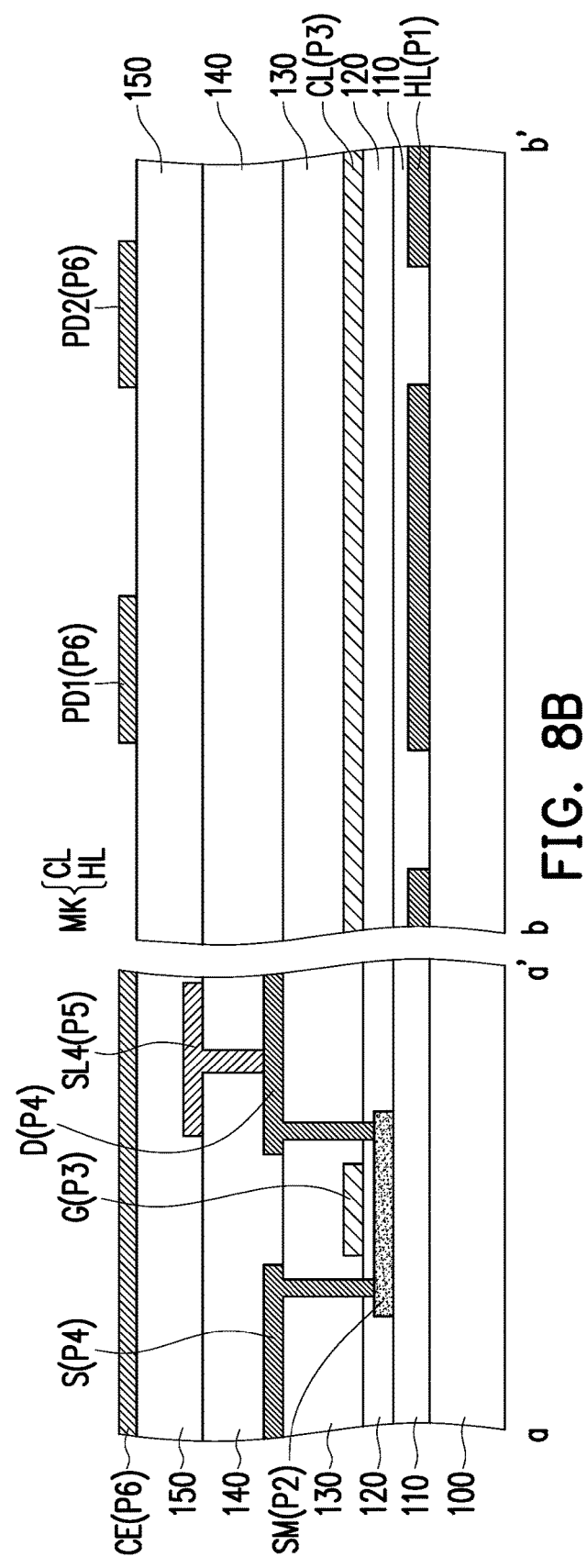
FIG. 8A
FIG. 8B

DISPLAY PANEL

CROSS-REFERENCE TO RELATED APPLICATION

This application claims the priority benefit of Taiwan application serial no. 111127293, filed on Jul. 21, 2022. The entirety of the above-mentioned patent application is hereby incorporated by reference herein and made a part of this specification.

BACKGROUND

Technical Field

The disclosure relates to a display panel and particularly relates to a display panel including a mark structure.

Description of Related Art

With the rapid development of display technologies, the market demand for large format displays (LFDs) is also increasing. At present, a splicing technology is one of the main options to form the LFDs.

The splicing technology is to splice a plurality of smaller-sized display panels to form the LFD. In a splicing display device, mark structures are usually provided in the display panels to identify these different display panels. Generally, the mark structures are arranged in border regions of the display panels.

SUMMARY

The disclosure relates to a display panel capable of solving an issue that an area of a display region is limited by a mark structure.

At least one embodiment of the disclosure provides a display panel, and the display panel includes a substrate, a mark structure, a plurality of active elements, and a plurality of light emitting element. The mark structure is disposed in a mark region of the display panel, and the mark structure includes a drilled layer having a plurality of through holes. The active elements are disposed in an active element region of the display panel. Both the mark region and the active element region are located in a display region of the display panel. The light emitting elements are disposed in the display region of the display panel, where a first portion of the light emitting elements is overlapped with the mark structure in a normal direction of a surface of the substrate.

In light of the foregoing, since the light emitting elements are overlapped with the mark structure, the mark structure does not play a role in limiting the area of the display region, so as to obtain a display panel with slim border frames or a frameless display panel.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 2A to FIG. 9A are schematic partial top views illustrating a manufacturing method of a display panel according to an embodiment of the disclosure.

FIG. 2B to FIG. 9B are schematic partial cross-sectional views illustrating a manufacturing method of a display panel according to an embodiment of the disclosure.

DESCRIPTION OF THE EMBODIMENTS

Figure 1:
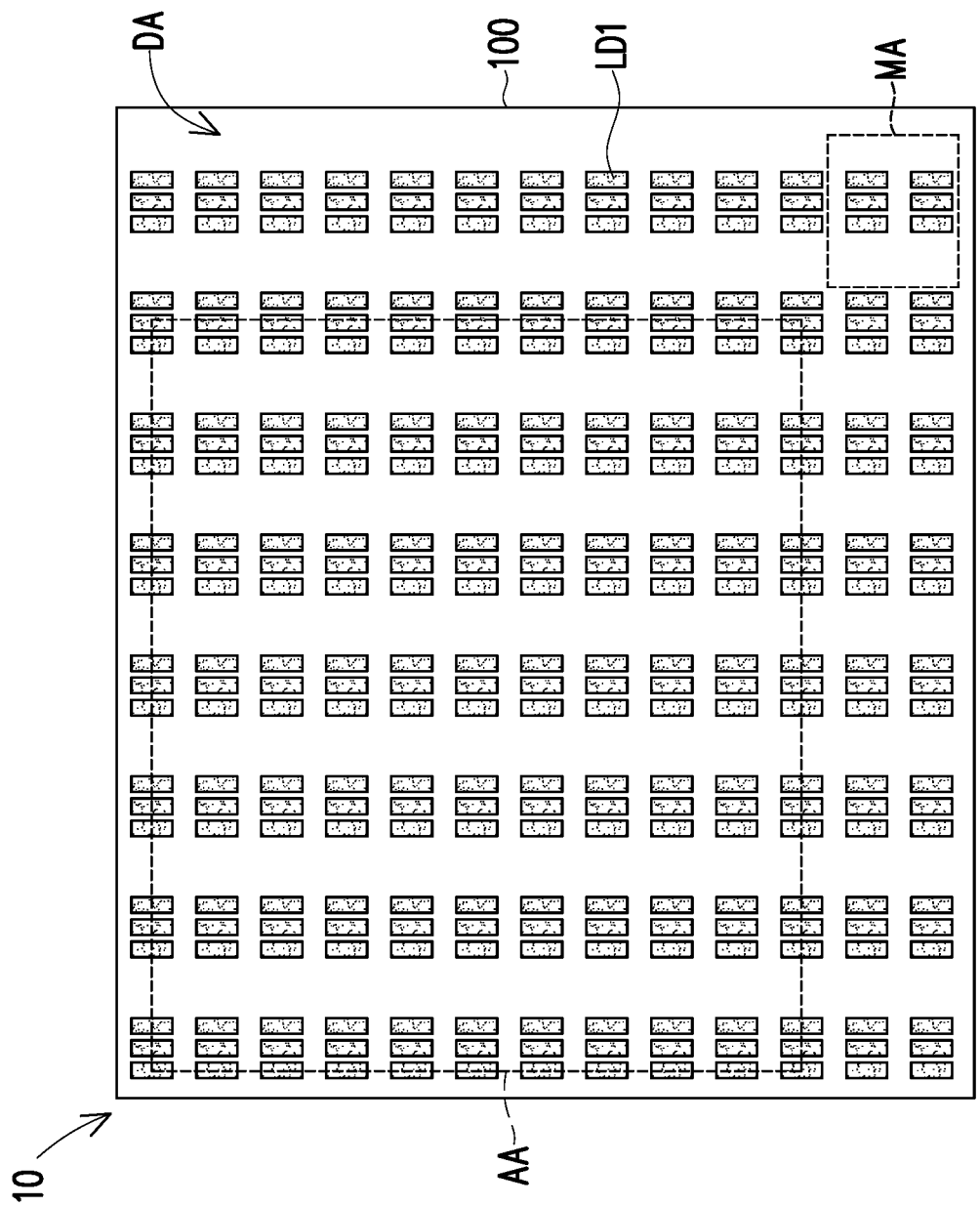
FIG. 1 is a schematic top view of a display panel according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

FIG. 1 is a schematic top view of a display panel according to an embodiment of the disclosure. In FIG. 1, a substrate 100 of a display panel 10 and light emitting elements LD1 are illustrated, while other structures are omitted.

With reference to FIG. 1, the display panel 10 includes the substrate 100, a mark structure (not shown), a plurality of active elements (not shown), and a plurality of light emitting elements LD1.

The mark structure is disposed in a mark region MA of the display panel 10. In some embodiments, the mark structure includes, for instance, a data matrix code.

The active elements are disposed in an active element region AA of the display panel 10. In some embodiments, the active elements are arranged in an array in the active element region AA of the display panel 10. The active elements may be thin film transistors of any type, such as top-gate thin film transistors, bottom-gate thin film transistors, dual-gate thin film transistors, or other types of thin film transistors. In some embodiments, the active elements in the active element region AA include many different types of thin film transistors.

The light emitting elements LD1 are disposed in a display region DA of the display panel. In some embodiments, the light emitting elements LD1 are arranged in an array in the display region DA of the display panel. The light emitting elements LD1 may be self-illuminating light emitting elements of any type, such as micro light emitting diodes, organic light emitting diodes (OLEDs), or other types of light emitting elements. In some embodiments, the active elements in the active element region AA are electrically connected to the light emitting elements LD1 through a circuit structure. In this embodiment, since a portion of the light emitting elements LD1 is not located in the active element region AA, a portion of the circuit structure extends from the active element region AA to the outside of the active element region AA and electrically connects the active elements in the active element region AA to the light emitting elements LD1 outside the active element region AA.

In this embodiment, both the mark region MA and the active element region AA are located in the display region DA of the display panel. In this embodiment, the mark region MA is separated from the active element region AA. A first portion of the light emitting elements LD1 is overlapped with the mark region MA; a second portion of the light emitting elements LD1 is overlapped with the active element region AA; a third portion of the light emitting elements LD1 is located in the display region DA other than the mark region MA and the active element region AA. In this embodiment, since the mark region MA is overlapped with the display region DA, it is not necessary to arrange the mark region MA in a border region; what is more, it is not necessary to arrange any border region in the display panel 10. Therefore, the display panel 10 has the advantages of having slim border frames or even being frameless. In some embodiments, the display panel 10 is adapted to a splicing display device. For instance, a plurality of the display panels 10 are spliced together to constitute an LFD device. Since the display panel 10 may have the advantage of being frameless, the problem encountered by the displayed images due to the seams formed by the splicing process may be better solved.

According to this embodiment, the mark region MA is located at the lower right corner of the display region DA, and the active element region AA is disposed at the upper left corner of the display region DA, which should however not be construed as a limitation in the disclosure. The mark region MA and the active element region AA may be disposed at any location in the display region DA according to actual requirements.

FIG. 2A to FIG. 9A are schematic partial top views illustrating a manufacturing method of a display panel according to an embodiment of the disclosure. FIG. 2B to FIG. 9B are schematic partial cross-sectional views illustrating a manufacturing method of a display panel according to an embodiment of the disclosure. FIG. 2B to FIG. 9B respectively correspond to a line a-a' and a line b-b' in FIG. 2A to FIG. 9A. In addition, for the convenience of description, structures shown in FIG. 2A to FIG. 9A and FIG. 2B to FIG. 9B are not illustrated to scale. For instance, in FIG. 2A to FIG. 9A, the magnification ratio of the active element region AA is greater than that of the mark region MA.

With reference to FIG. 2A and FIG. 2B, and a first pattern layer P1 is formed on the substrate 100. In this embodiment, the first pattern layer P1 includes a drilled layer HL located in the mark region MA. The drilled layer HL has a code region CR and an alignment mark region AMR surrounding the code region CR. The drilled layer HL includes an alignment mark AM located in the alignment mark region AMR. The alignment mark AM may be of any geometric shape. For instance, in this embodiment, the drilled layer HL includes a cross-shaped alignment mark AM at the upper right corner, a rectangular alignment mark AM at the upper left corner, and a triangular alignment mark AM at the lower left corner.

In this embodiment, a method of forming the first pattern layer P1 includes: depositing a light shielding material layer onto the substrate 100 and then obtaining the first pattern layer P1 by patterning the light shielding material layer through a photolithography and etching process (PEP). In some embodiments, the light shielding material layer includes a conductive material (e.g., metal, metal oxides, metal nitrides, silicon, or other appropriate materials), black resin, or other opaque materials. In some embodiments, the first pattern layer P1 further includes a light shielding pattern (not shown) or a conductive pattern (not shown) located in the active element region AA, and the first pattern layer P1 is not limited to be located in the mark region MA in the disclosure.

Figure 3A:
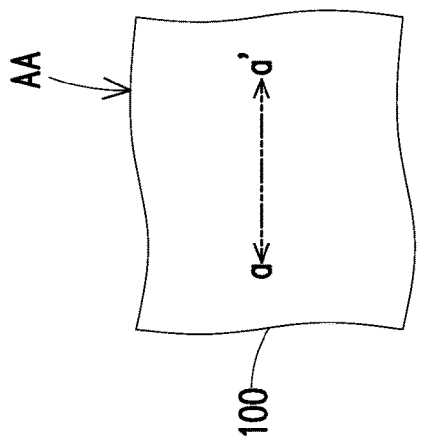
Figure 3A:
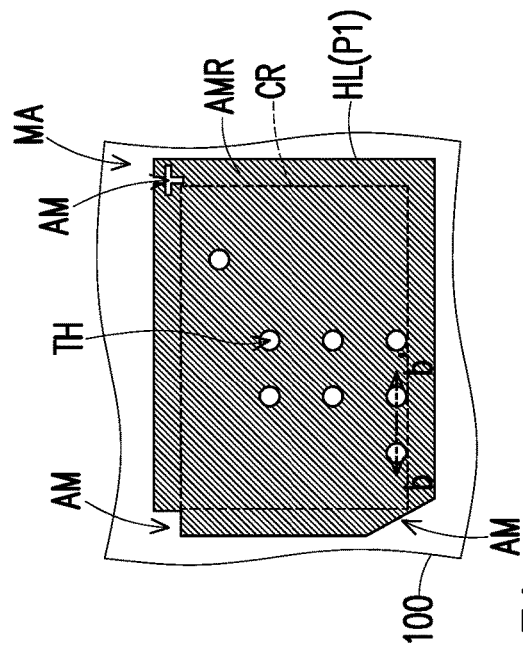
Figure 3B:
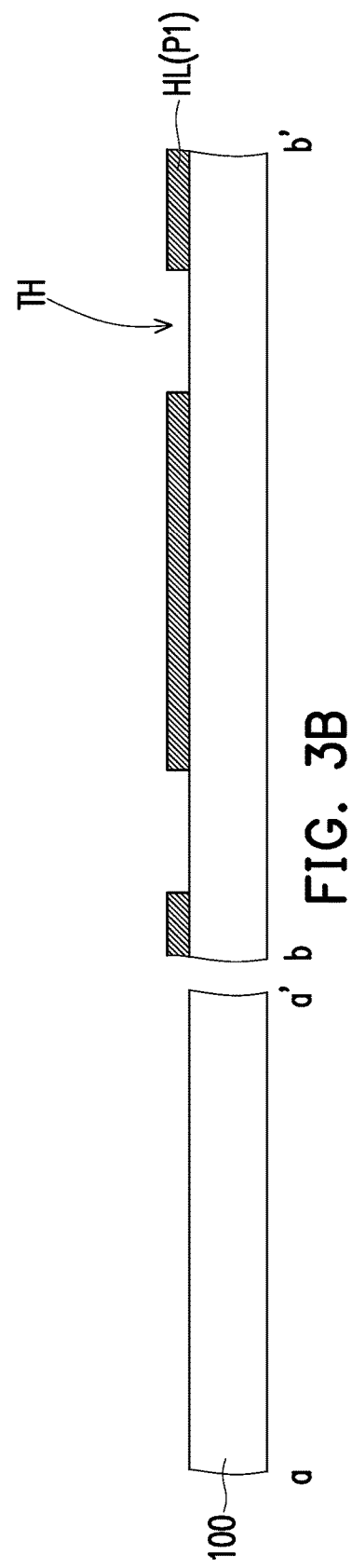

With reference to FIG. 3A and FIG. 3B, an informatization process is performed on the code region CR of the drilled layer HL to form a plurality of through holes TH in the code region CR. In some embodiments, the informatization process includes dry etching (e.g., laser) or wet etching. In some embodiments, the informatization process may further include a lithography process. In some embodiments, the through holes TH constitute the data matrix code. In this embodiment, the location of the drilled layer HL may be determined by the alignment mark AM of the drilled layer HL, so as to reduce the possibility of shift of the informatization process. In FIG. 3A and FIG. 3B, the number, the location, and the size of the through holes TH are exemplary instead of being construed as limitations in the disclosure; in other words, the number, the location, and the size of the through holes TH may be adjusted according to actual needs. The shape of an orthogonal projection of the through holes TH on the substrate 100 may be circular, which should however not be construed as a limitation in the disclosure. In some embodiments, the shape of the orthogonal projection of the through holes TH on the substrate 100 may be characters, symbols, or other graphics.

Figure 4A:
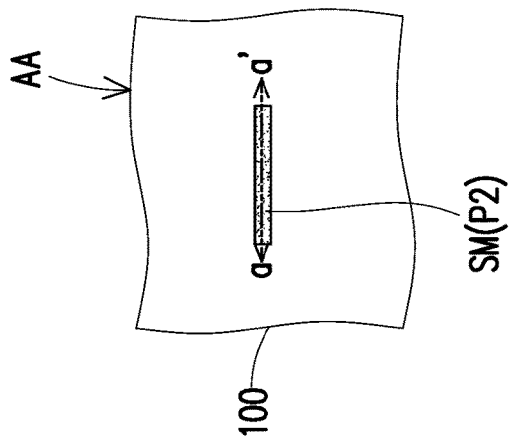
Figure 4B:
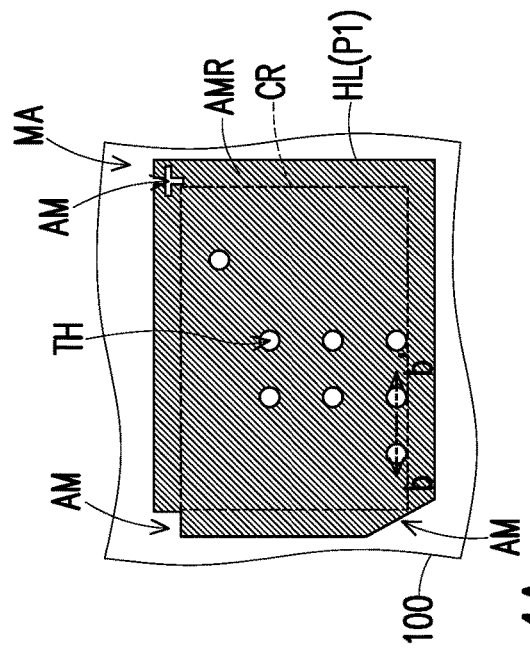
Figure 4B:
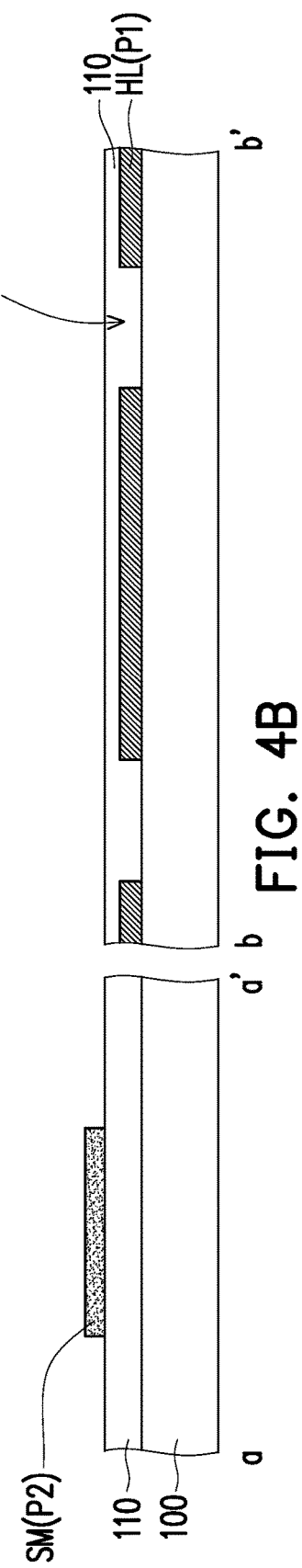

With reference to FIG. 4A and FIG. 4B, a first dielectric layer 110 is formed on the substrate 100 and the first pattern layer P1. In some embodiments, a material of the first dielectric layer 110 includes oxides, nitrides, oxynitrides, an organic material, other appropriate materials, or a stacked layer of the above materials. In this embodiment, the first dielectric layer 110 fills the through holes TH and the alignment mark AM of the drilled layer HL.

Next, a second pattern layer P2 is formed on the first dielectric layer 110. In this embodiment, the second pattern layer P2 includes a plurality of semiconductor structures SM located in the active element region AA. For convenience of description, FIG. 4A and FIG. 4B illustrate one semiconductor structure SM. The semiconductor structures SM in the active element region AA may be of various shapes. For instance, the shape of the semiconductor structures SM may include a bar shape, an L shape, a hook shape, or any other geometric shape.

In this embodiment, a method of forming the second pattern layer P2 includes depositing a semiconductor material layer onto the first dielectric layer 110 and obtaining the second pattern layer P2 by patterning the semiconductor material layer through the PEP. In some embodiments, a material of the second pattern layer P2 includes amorphous silicon (a-Si), polysilicon, microcrystalline silicon, monocrystalline silicon, an organic semiconductor material, an oxide semiconductor material, other appropriate materials, or a combination thereof.

Figure 5A:
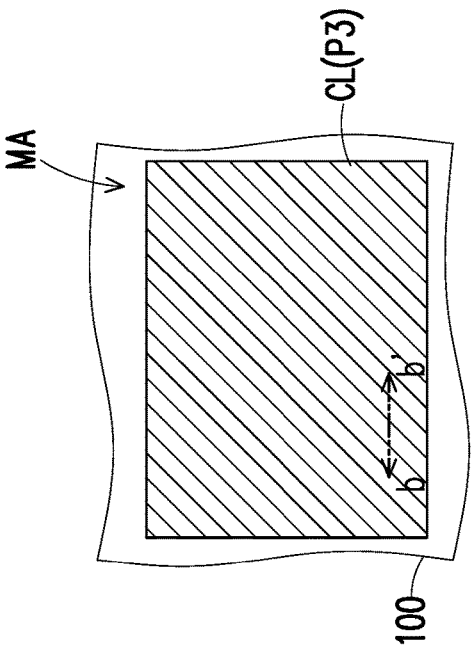
Figure 5A:
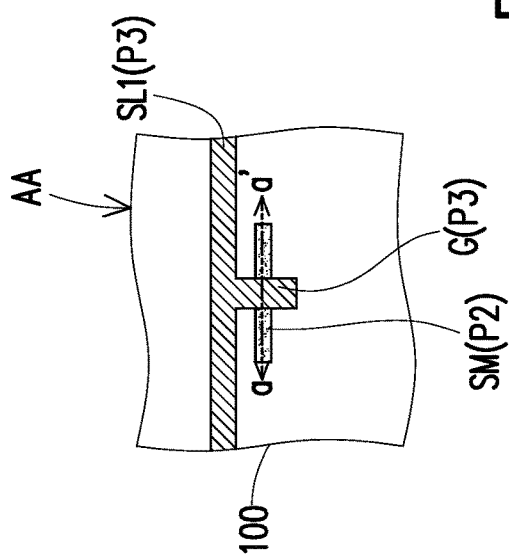
Figure 5B:
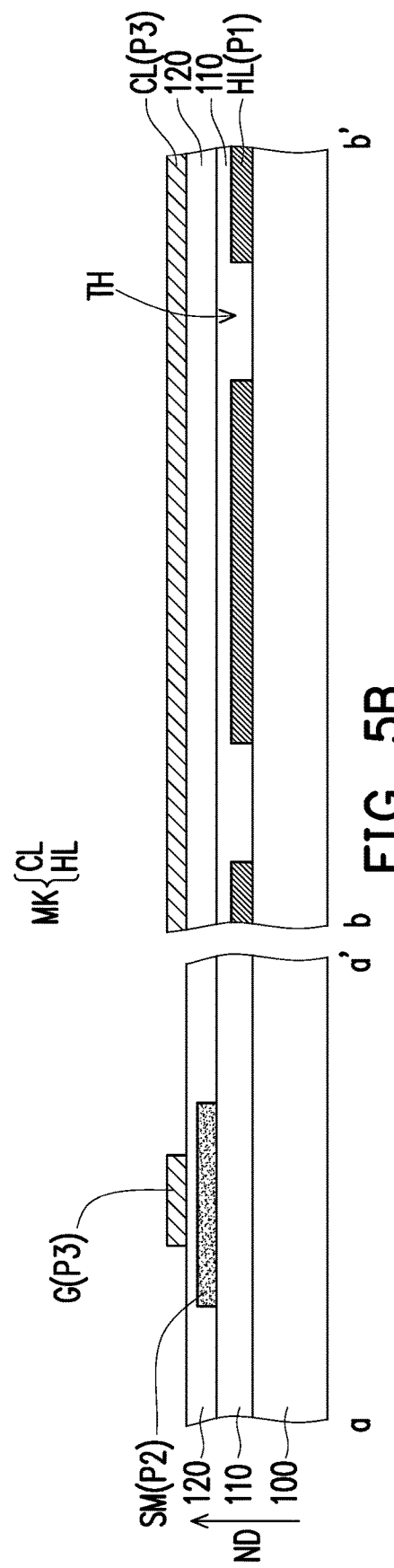

With reference to FIG. 5A and FIG. 5B, a second dielectric layer 120 is formed on the first dielectric layer 110 and the second pattern layer P2. In some embodiments, a material of the second dielectric layer 120 includes oxides, nitrides, oxynitrides, an organic material, other appropriate materials, or a stacked layer of the above materials.

Next, a third pattern layer P3 is formed on the second dielectric layer 120. In this embodiment, the third pattern layer P3 includes a plurality of signal lines SL1, a plurality of gates G, and a shielding layer CL.

In this embodiment, a method of forming the third pattern layer P3 includes depositing a conductive material layer onto the second dielectric layer 120 and obtaining the third pattern layer P3 by patterning the conductive material layer through the PEP. In some embodiments, a material of the third pattern layer P3 includes metal, metal oxides, metal nitrides, or other appropriate materials.

The signal lines SL1 and the gates G are located in the active element region AA. For convenience of description, FIG. 5A shows one of the signal lines SL1 and one of the gates G. The gates G are connected to the corresponding signal lines SL1, and the gates G are overlapped with the corresponding semiconductor structures SM in a normal direction ND of a surface of the substrate 100.

The shielding layer CL is located in the mark region MA. The shielding layer CL is overlapped with the through holes TH and the alignment mark AM in the normal direction ND of the surface of the substrate 100. In this embodiment, the mark structure MK includes the shielding layer CL and the drilled layer HL, and the shielding layer CL and the drilled layer HL are spaced from each other by the first dielectric layer 110 and the second dielectric layer 120. In other words, in this embodiment, the shielding layer CL is overlapped with and separated from the drilled layer HL. The arrangement of the shielding layer CL prevents other structures (such as the circuit structure and the light emitting elements) formed above the shielding layer CL in subsequent processes from affecting a reading operation on the code region CR of the drilled layer HL. Specifically, when a reading operation is performed on the code region CR of the drilled layer HL from a back surface of the display panel (a lower surface of the substrate 100), other structures above the shielding layer CL are shielded by the shielding layer CL, thereby avoiding other structures above the shielding layer from affecting the reading operation.

With reference to FIG. 6A and FIG. 6B, a third dielectric layer 130 is formed on the second dielectric layer 120 and the third pattern layer P3. In some embodiments, a material of the third dielectric layer 130 includes oxides, nitrides, oxynitrides, an organic material, other appropriate materials, or a stacked layer of the above materials. In some embodiments, the PEP is performed on the second dielectric layer 120 and the third dielectric layer 130 to form openings in the second dielectric layer 120 and the third dielectric layer 130. The openings, for instance, expose the semiconductor structures SM.

Next, a fourth pattern layer P4 is formed on the third dielectric layer 130. In this embodiment, the fourth pattern layer P4 includes a plurality of signal lines SL2, a plurality of sources S, a plurality of drains D, and a plurality of signal lines SL3.

In this embodiment, a method of forming the fourth pattern layer P4 includes depositing a conductive material layer onto the third dielectric layer 130 and obtaining the fourth pattern layer P4 by patterning the conductive material layer through the PEP. In some embodiments, a material of the fourth pattern layer P4 includes metal, metal oxides, metal nitrides, or other appropriate materials.

The signal lines SL2, the sources S, and the drains D are located in the active element region AA. For convenience of description, FIG. 6A shows one of the signal lines SL2, one of the sources S, and one of the drains D. The sources S and the drains D fill the openings of the second dielectric layer 120 and the third dielectric layer 130 and are connected to the corresponding semiconductor structures SM. Each of the sources S is connected to one of the corresponding signal lines SL2. In this embodiment, the gates G, the semiconductor structures SM, the sources S, and the drains D constitute active elements 200. A plurality of the active elements 200 are arranged in an array in the active element region AA. In this embodiment, the active elements 200 are top-gate thin film transistors, but the active element region AA provided herein is not limited to merely contain the top-gate thin film transistors. In some embodiments, the active element region AA further includes thin film transistors of other types.

The signal lines SL3 are located in the mark region MA and extend from the mark region MA to the outside of the mark region MA. A portion of the signal lines SL3 is overlapped with the mark structure MK in the normal direction ND of the surface of the substrate 100.

With reference to FIG. 7A and FIG. 7B, a fourth dielectric layer 140 is formed on the third dielectric layer 130 and the fourth pattern layer P4. In some embodiments, a material of the fourth dielectric layer 140 includes oxides, nitrides, oxynitrides, an organic material, other appropriate materials, or a stacked layer of the above materials. In some embodiments, the fourth dielectric layer 140 performs the PEP to form openings in the fourth dielectric layer 140. The openings, for instance, expose the drains D.

Next, a fifth pattern layer P5 is formed on the fourth dielectric layer 140. In this embodiment, the fifth pattern layer P5 includes a plurality of signal lines SL4.

In this embodiment, a method of forming the fifth pattern layer P5 includes depositing a conductive material layer onto the fourth dielectric layer 140 and obtaining the fifth pattern layer P5 by patterning the conductive material layer through the PEP. In some embodiments, a material of the fifth pattern layer P5 includes metal, metal oxides, metal nitrides, or other appropriate materials.

The signal lines SL4 are disposed in the active element region AA, and each of the signal lines SL4 is electrically connected to the drain D of one of the corresponding active elements 200. For instance, the signal lines SL4 fill the openings of the fourth dielectric layer 140, so as to be connected to the corresponding drains D. In this embodiment, at least one portion of the signal lines SL4 extends from the active element region AA to the display region outside the active element region AA. For instance, one portion of the signal lines SL4 extends from the active element region AA to the mark region MA. The one portion of the signal lines SL4 is overlapped with the mark structure MK in the normal direction ND of the surface of the substrate 100. In addition, the other portion of the signal lines SL4 is not extended to the outside of the active element region AA.

In this embodiment, the circuit structure CS includes the signal lines SL1, the signal lines SL2, the signal lines SL3, and the signal lines SL4. A portion of the circuit structure CS is overlapped with the mark structure MK in the normal direction ND of the surface of the substrate 100. For instance, the signal lines SL3 and the signal lines SL4 in the circuit structure CS are partially overlapped with the mark structure MK in the normal direction ND.

With reference to FIG. 8A and FIG. 8B, a fifth dielectric layer 150 is formed on the fourth dielectric layer 140 and the fifth pattern layer P5. In some embodiments, a material of the fifth dielectric layer 150 includes oxides, nitrides, oxynitrides, an organic material, other appropriate materials, or a stacked layer of the above materials. In some embodiments, the fifth dielectric layer 150 performs the PEP to form openings in the fifth dielectric layer 150. The openings, for instance, expose the signal lines SL4.

Next, a sixth pattern layer P6 is formed on the fifth dielectric layer 150. In this embodiment, the sixth pattern layer P6 includes a common electrode CE, a plurality of first pads PD1, and a plurality of second pads PD2.

In this embodiment, a method of forming the sixth pattern layer P6 includes depositing a conductive material layer onto the fifth dielectric layer 150 and obtaining the sixth pattern layer P6 by patterning the conductive material layer through the PEP. In some embodiments, a material of the sixth pattern layer P6 includes metal, metal oxides, metal nitrides, or other appropriate materials.

The common electrode CE, the first pads PD1, and the second pads PD2 are located in the display region, and the common electrode CE extends from the active element region AA to the mark region MA. In this embodiment, a first portion of the common electrode CE, a first portion of the first pads PD1, and a first portion of the second pads PD2 are located in the active element region AA; a second portion of the common electrode CE, a second portion of the first pads PD1, and a second portion of the second pads PD2 are located in thin the mark region MA; a third portion of the common electrode CE, a third portion of the first pads PD1, and a third portion of the second pads PD2 are located in the display region other than the active element region AA and the mark region MA.

In this embodiment, the common electrode CE has a plurality of openings, and each of the openings corresponds to one pixel. The first pads PD1 and the second pads PD2 are located in the openings of the common electrode CE, where the second pads PD2 are connected to the common electrode CE, and the first pads PD1 are connected to the corresponding signal lines SL4. For instance, the first pads PD1 fill the openings of the fifth dielectric layer 150, so as to be connected to the corresponding signal lines SL4.

Figure 9A:
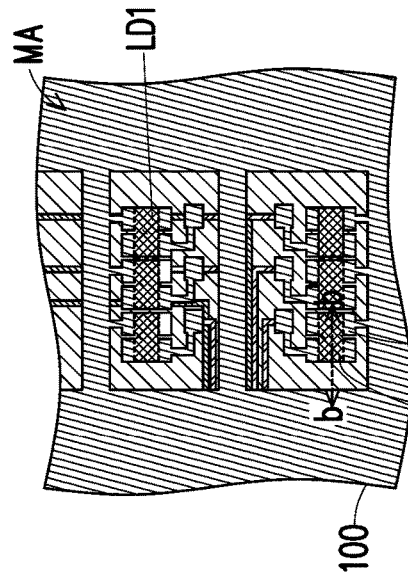
Figure 9B:
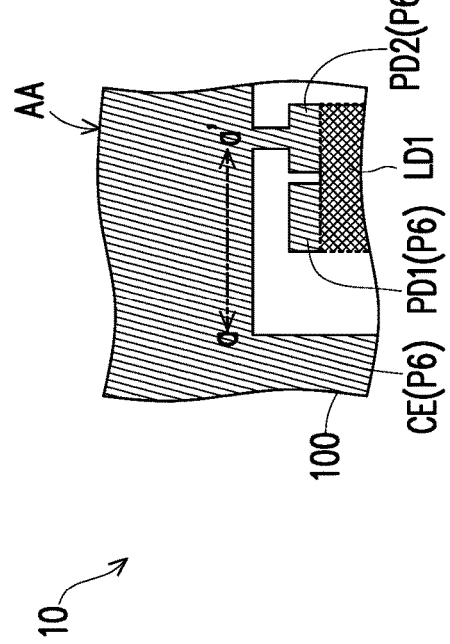
Figure 9B:
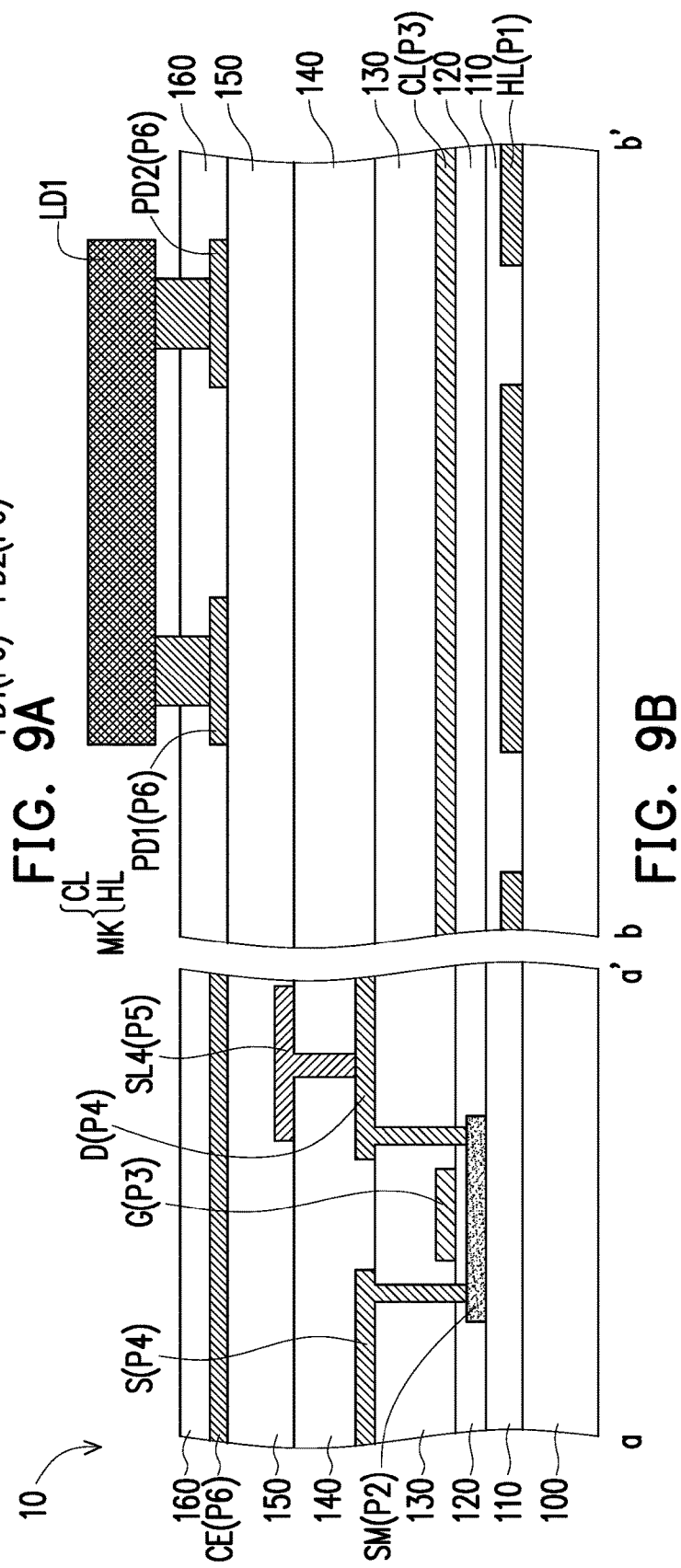

With reference to FIG. 9A and FIG. 9B, a sixth dielectric layer 160 is formed on the fifth dielectric layer 150 and the sixth pattern layer P6. In some embodiments, a material of the sixth dielectric layer 160 includes oxides, nitrides, oxynitrides, an organic material, other appropriate materials, or a stacked layer of the above materials. In some embodiments, the sixth dielectric layer 160 includes a solder mask material. In some embodiments, the PEP is performed on the sixth dielectric layer 160 to form openings in the sixth dielectric layer 160. The openings, for instance, expose the first pads PD1 and the second pads PD2.

Next, the light emitting elements LD1 are bonded to the sixth pattern layer P6. For instance, each of the light emitting elements LD1 are connected to the corresponding first pad PD1 and the corresponding second pad PD2 through a solder material, an anisotropic conductive film (ACF), or other connection to material. The circuit structure CS (shown in FIG. 7A) is electrically connected to the light emitting elements LD1 through the first pads PD1, and the common electrode CE is electrically connected to the light emitting elements LD1 through the second pads PD2. In some embodiments, the light emitting elements LD1 include micro LEDs of different colors.

The light emitting elements LD1 are scattered in the display region. In this embodiment, a first portion of the light emitting elements LD1 is located in the mark region MA and overlapped with the mark structure MK in the normal direction ND of the surface of the substrate 100; a second portion of the light emitting elements LD1 is located in the active element region AA; a third portion of the light emitting elements LD1 is located in the display region other than the active element region AA and the mark region MA. In this embodiment, the circuit structure CS (shown in FIG. 7A) is electrically connected to the light emitting elements LD1 through the first pads PD1 and the second pads PD2 of the sixth pattern layer P6. Through the arrangement of the circuit structure CS, the active elements 200 in the active element region AA are not only electrically connected to the second portion of the light emitting elements LD1 in the active element region AA but also electrically connected to the third portion and the first portion of the emitting elements LD1 outside the active element region AA.

Based on the above, since the first portion of the light emitting elements LD1 is overlapped with the mark structure MK, the display region of the display panel 10 may cover the range of the mark region MA, thereby increasing the area of the display region.

Figure 10:
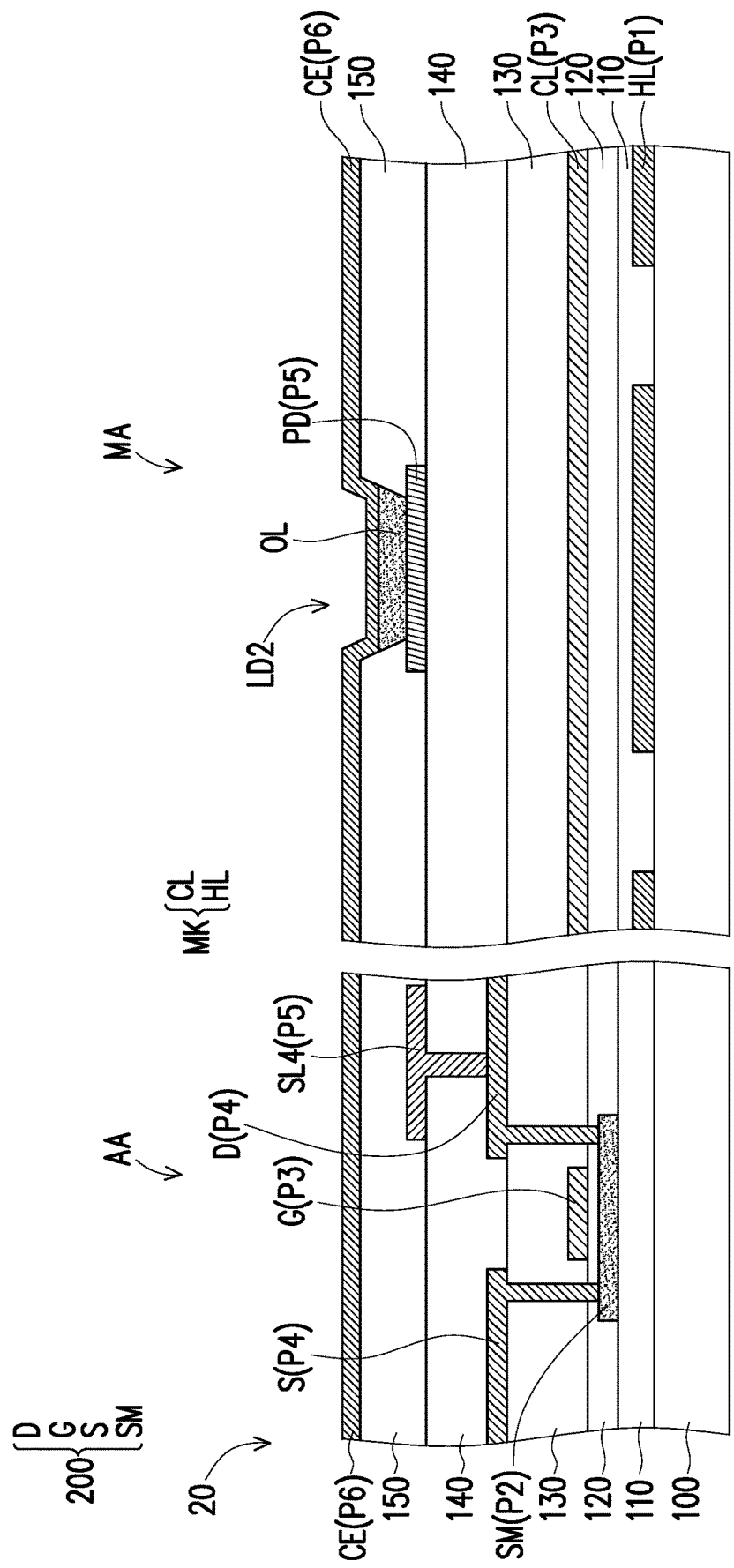
FIG. 10 is a schematic cross-sectional view of a display panel according to an embodiment of the disclosure.

FIG. 10 is a schematic cross-sectional view of a display panel according to an embodiment of the disclosure. Note that the reference numbers and some content provided in the embodiment depicted in FIG. 10 are derived from the reference numbers and some content provided in the previous embodiments depicted in FIG. 2B to FIG. 9B, the same reference numbers serve to denote the same or similar devices, and the description of the same technical content is omitted. The omitted description may be referred to as the description provided in the previous embodiments and will not be repeated in the following embodiments.

The main difference between a display panel 20 depicted in FIG. 10 and the display panel 10 depicted in FIG. 9B lies in that the light emitting elements LD1 in the display panel 10 are micro LEDs, and light emitting elements LD2 in the display panel 20 are OLEDs.

With reference to FIG. 10, the fifth pattern layer P5 includes a plurality of signal lines SL4 and a plurality of electrodes PD.

The signal lines SL4 are disposed in the active element region AA, and each of the signal lines SL4 is electrically connected to the drain D of one of the corresponding active elements 200. In this embodiment, at least one portion of the signal lines SL4 extends from the active element region AA to the display region outside the active element region AA. For instance, a portion of the signal lines SL4 extends from active element region AA to the mark region MA and is connected to the electrodes PD in the mark region MA. A portion of the signal lines SL4 is overlapped with the mark structure MK in the normal direction ND of the surface of the substrate 100.

The electrodes PD are distributed in the display region. Each of the electrodes PD is electrically connected to one of the corresponding signal lines SL4. In this embodiment, a first portion of the electrodes PD is located in the mark region MA; a second portion of the electrodes PD (not shown) is located in the active element region AA; a third portion of the electrodes PD (not shown) is located in the display region other than the active element region AA and the mark region MA.

The fifth dielectric layer 150 is located on the fifth pattern layer P5 and has a plurality of openings overlapped with the electrodes PD. A plurality of organic material layers OL respectively fill the openings of the fifth dielectric layer 150 and are connected to the electrodes PD. The common electrode CE is located on the fifth dielectric layer 150 and connected to the organic material layers OL.

The common electrode CE, the organic material layers OL, and the electrodes PD are overlapped to constitute the light emitting elements LD2. The light emitting elements LD2 are scattered in the display region. In this embodiment, a first portion of the light emitting elements LD2 is located in the mark region MA and overlapped with the mark structure MK in the normal direction ND of the surface of the substrate 100; a second portion of the light emitting elements LD2 is located in the active element region AA; a third portion of the light emitting elements LD2 is located in the display region other than the active element region AA and mark region MA. In this embodiment, the active elements 200 in the active element region AA are electrically connected to the light emitting elements LD2 through the circuit structure. Through the arrangement of the circuit structure CS, the active elements 200 in the active element region AA are not only electrically connected to the second portion of the light emitting elements LD2 in the active element region AA but also electrically connected to the third portion and the first portion of the emitting elements LD2 outside the active element region AA.

Based on the above, since the first portion of the light emitting elements LD2 is overlapped with the mark structure MK, the display region of the display panel 20 may cover the range of the mark region MA, thereby increasing the area of the display region.

Figure 11:
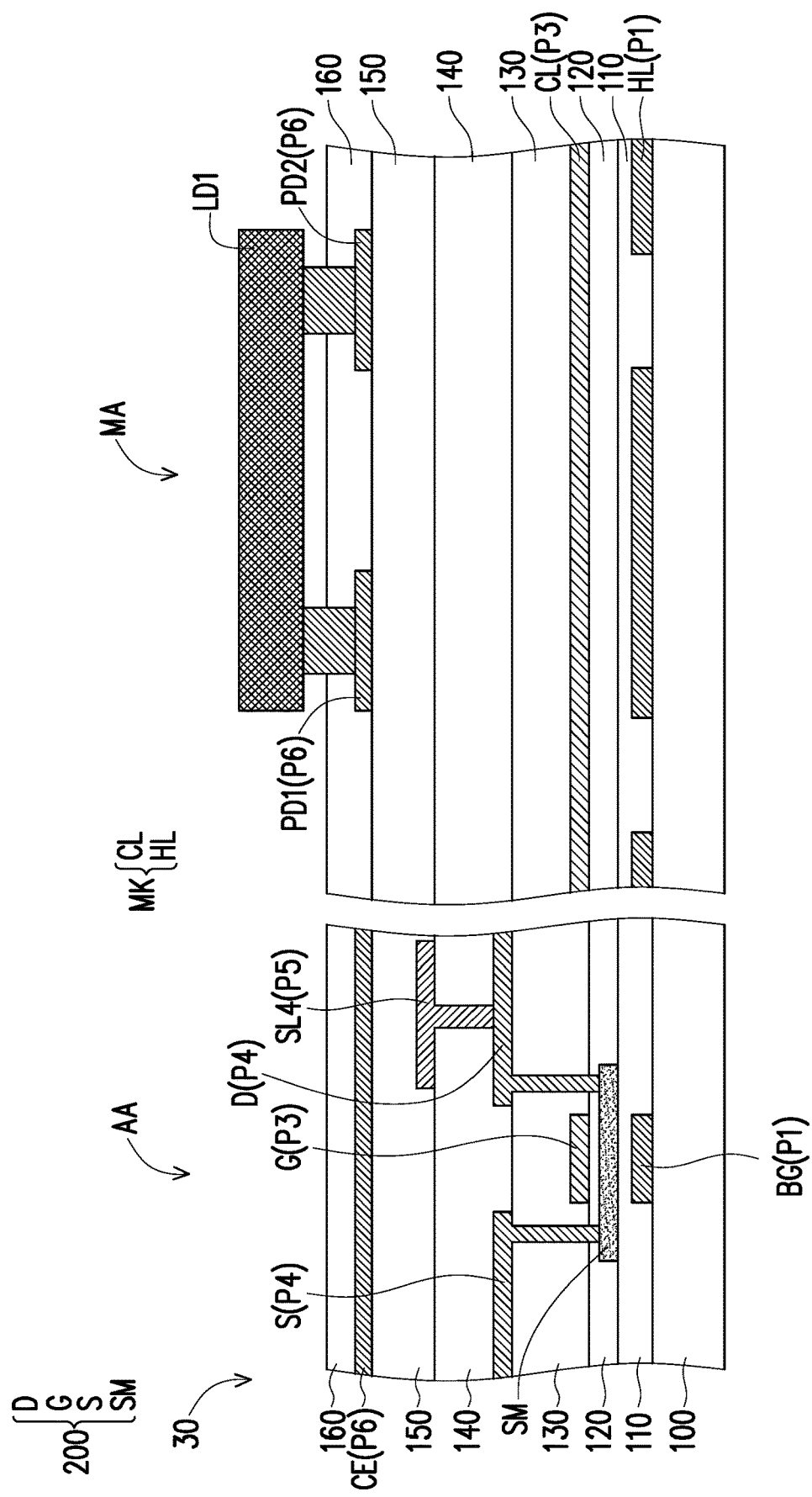
FIG. 11 is a schematic cross-sectional view of a display panel according to an embodiment of the disclosure.

FIG. 11 is a schematic cross-sectional view of a display panel according to an embodiment of the disclosure. Note that the reference numbers and some content provided in the embodiment depicted in FIG. 11 are derived from the reference numbers and some content provided in the previous embodiments depicted in FIG. 2B to FIG. 9B, the same reference numbers serve to denote the same or similar devices, and the description of the same technical content is omitted. The omitted description may be referred to as the description provided in the previous embodiments and will not be repeated in the following embodiments.

The main difference between a display panel 30 depicted in FIG. 11 and the display panel 10 depicted in FIG. 9B lies in that the active elements 200 in the display panel 30 are dual-gate thin film transistors.

With reference to FIG. 11, in this embodiment, the active element 200 further includes a bottom gate BG. The bottom gate BG and the drilled layer HL belong to one film layer (the first pattern layer P1), for instance. In other words, the bottom gate BG and the drilled layer HL are formed simultaneously. A gate G of the active element 200 is the top gate, and the gate G and the shielding layer CL belong to one film layer (the third pattern layer P3). In other words, the gate G and the shielding layer CL are formed simultaneously.

Figure 12:
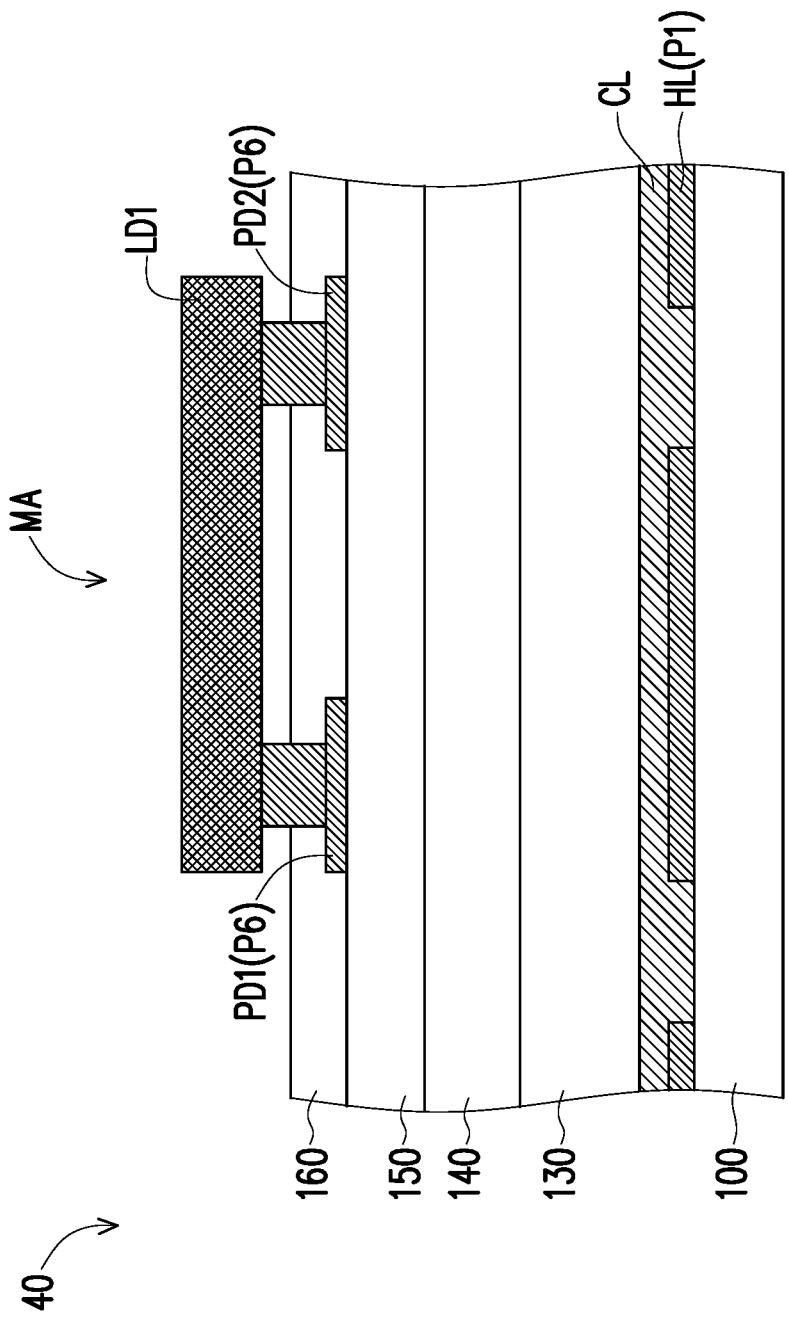
FIG. 12 is a schematic cross-sectional view of a display panel according to an embodiment of the disclosure.

FIG. 12 is a schematic cross-sectional view of a display panel according to an embodiment of the disclosure. Note that the reference numbers and some content provided in the embodiment depicted in FIG. 12 are derived from the reference numbers and some content provided in the previous embodiments depicted in FIG. 2B to FIG. 9B, the same reference numbers serve to denote the same or similar devices, and the description of the same technical content is omitted. The omitted description may be referred to as the description provided in the previous embodiments and will not be repeated in the following embodiments.

The main difference between a display panel 40 depicted in FIG. 12 and the display panel 10 depicted in FIG. 9B lies in that the shielding layer CL in the display panel 40 is overlapped with and in contact with the drilled layer HL.

In this embodiment, the shielding layer CL is directly formed on the drilled layer HL, and the shielding layer CL fills the through holes TH. In this embodiment, a material of the shielding layer CL may include a conductive material, a semiconductor material, or an insulation material (e.g., black resin). In other words, the shielding layer CL is not limited to the third pattern layer P3 (shown in FIG. 5B) in this disclosure, and the shielding layer CL may also belong to other pattern layers.

Figure 13:
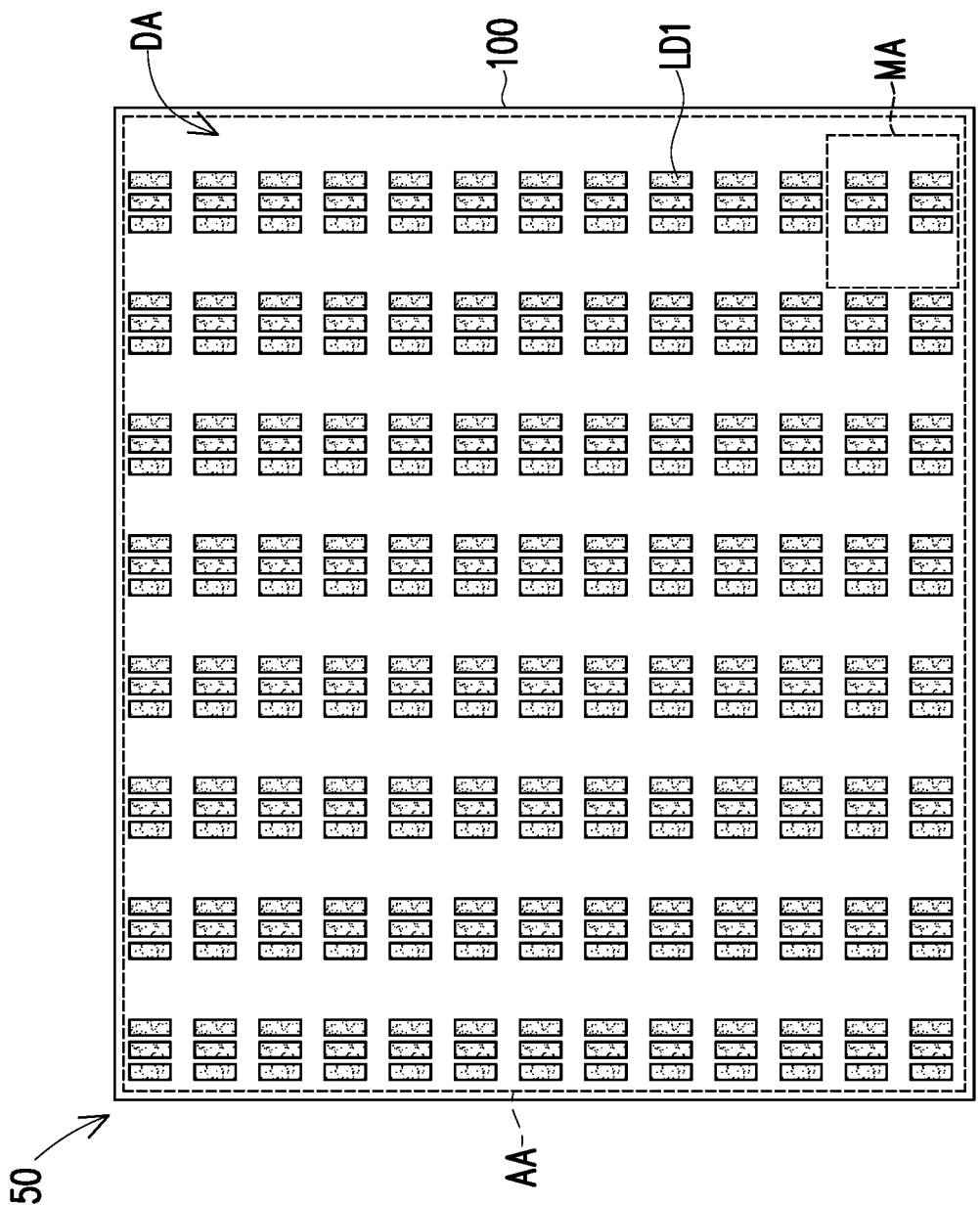
FIG. 13 is a schematic top view of a display panel according to an embodiment of the disclosure.

FIG. 13 is a schematic top view of a display panel according to an embodiment of the disclosure. Note that the reference numbers and some content provided in the embodiment depicted in FIG. 13 are derived from the reference numbers and some content provided in the previous embodiment depicted in FIG. 1, the same reference numbers serve to denote the same or similar devices, and the description of the same technical content is omitted. The omitted description may be referred to as the description provided in the previous embodiments and will not be repeated in the following embodiments.

The main difference between a display panel 50 depicted in FIG. 13 and the display panel 10 depicted in FIG. 1 lies in that the mark region MA of the display panel 50 is overlapped with the active element region AA. In other words, the mark region MA is located in the active element region AA.

In this embodiment, both the mark region MA and the active element region AA are located in the display region DA of the display panel. In this embodiment, a first portion of the light emitting elements LD1 is overlapped with the mark region MA; a second portion of the light emitting elements LD1 is overlapped with the display region DA outside the mark region MA. In this embodiment, since the mark region MA is overlapped with the display region DA, it is not necessary to arrange the mark region MA in the border region; what is more, it is not necessary to arrange any border region in the display panel 50. Therefore, the display panel 50 has the advantages of having slim border frames or even being frameless. In some embodiments, the display panel 50 is adapted to a splicing display device. For instance, a plurality of the display panels 50 are spliced together to constitute an LFD device. Since the display panel 50 may have the advantage of being frameless, the problem encountered by the displayed images due to the seams formed by the splicing process may be better solved.

Figure 14:
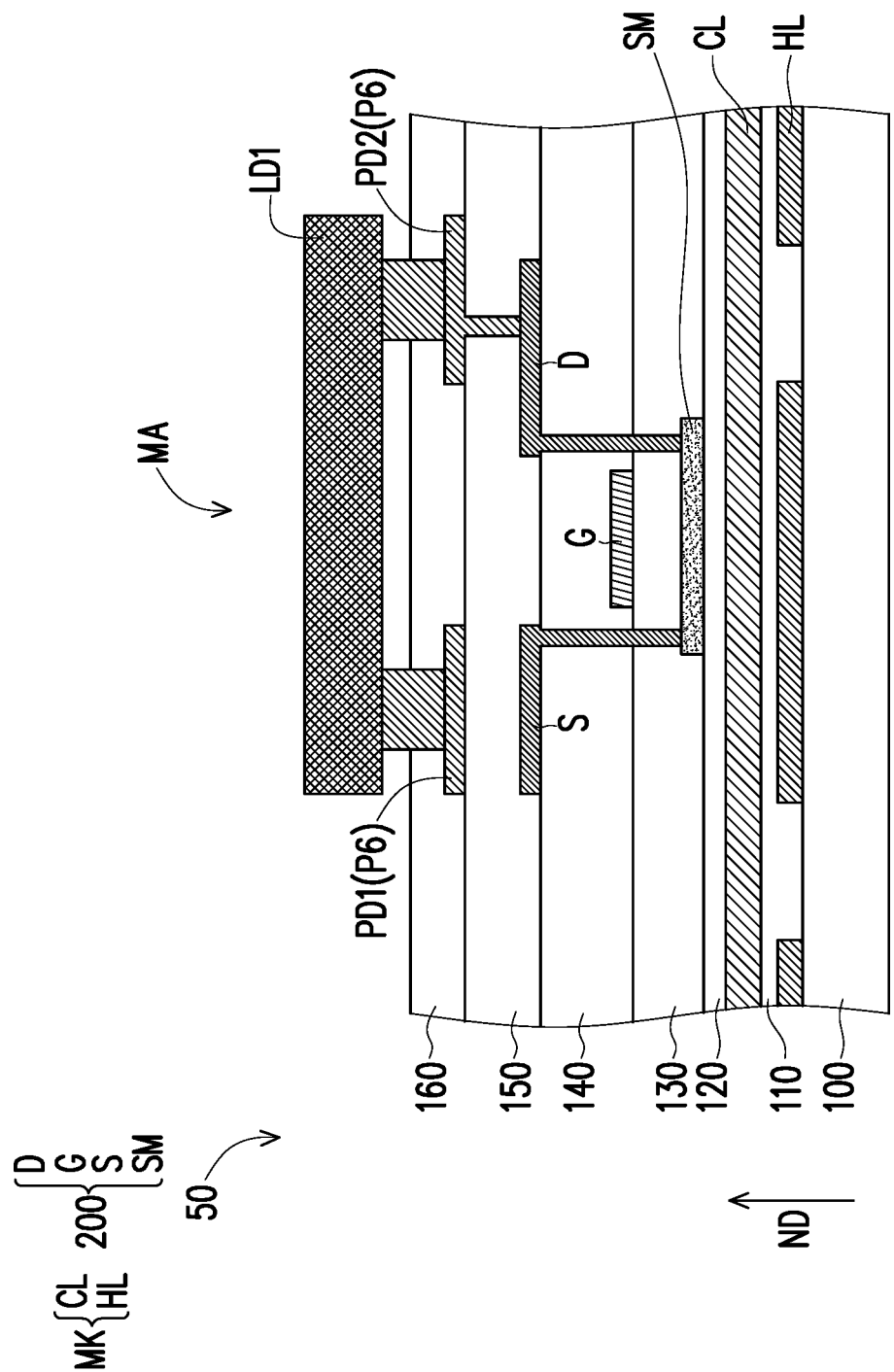
FIG. 14 is a schematic cross-sectional view of a display panel according to an embodiment of the disclosure.

FIG. 14 is a schematic cross-sectional view of a display panel according to an embodiment of the disclosure. For instance, FIG. 14 is a schematic cross-sectional view of the display panel 50 in FIG. 13 at the location of the mark region MA.

With reference to FIG. 14, in this embodiment, the active elements 200 are overlapped with the mark structure MK in the normal direction ND of the surface of the substrate 100.

Figure 15:
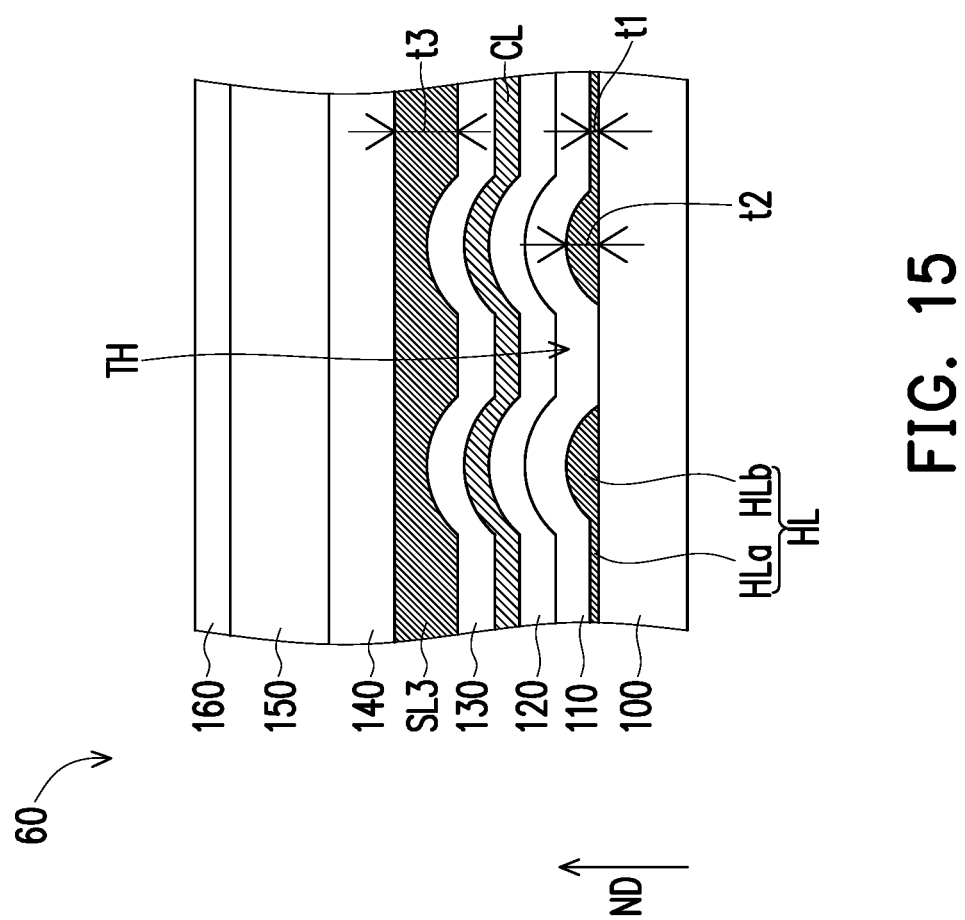
FIG. 15 is a schematic cross-sectional view of a display panel according to an embodiment of the disclosure.

FIG. 15 is a schematic cross-sectional view of a display panel according to an embodiment of the disclosure. For instance, FIG. 15 is a schematic cross-sectional view of a display panel 60 at the location of the mark region MA.

With reference to FIG. 15, in this embodiment, after the informatization process (the process described in the embodiment shown in FIG. 3A and FIG. 3B) including dry etching (e.g., laser) is performed on the drilled layer HL, peripheries of the through holes TH of the drilled layer HL are uplifted, so that the drilled layer HL includes a planar portion HLa and a plurality of uplifted portions HLb. The uplifted portions HLb surround the through holes TH. The circuit structure includes signal lines (e.g., the signal lines SL3). The signal lines SL3 are partially overlapped with the uplifted portions HLb in the normal direction ND of the surface of the substrate 100. In some embodiments, the first dielectric layer 110, the second dielectric layer 120, the shielding layer CL, and the third dielectric layer 130 may encounter an issue of uneven surfaces due to the uplifted portions HLb. In some embodiments, a thickness t2 of the uplifted portions HLb decreases together with the decrease in the thickness of the drilled layer HL (which may also be regarded as a thickness t1 of the planar portion HLa) before the informatization process is performed on the drilled layer HL. In some embodiments, the thickness t1 of the planar portion HLa may be reduced, or the thickness of the signal lines SL3 may be increased, so that the signal lines SL3 are less likely to be disconnected due to the unevenness of the underlying structures. In some embodiments, the thickness t1 of the planar portion HLa of the drilled layer HL is less than $\frac{1}{7}$ the thickness t3 of the signal lines SL3. In this embodiment, the drilled layer HL includes the uplifted portions HLb, which should however not be construed as a limitation in the disclosure. In other embodiments, the informatization process, for instance, includes wet etching, and the drilled layer HL does not include the uplifted portions HLb.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display panel, comprising:
   a substrate;
   a mark structure, disposed in a mark region of the display panel, wherein the mark structure comprises a drilled layer, and the drilled layer has a plurality of through holes;
   a plurality of active elements, disposed in an active element region of the display panel, wherein both the mark region and the active element region are located in a display region of the display panel; and
   a plurality of light emitting elements, disposed in the display region of the display panel, wherein a first portion of the light emitting elements is overlapped with the mark structure in a normal direction of a surface of the substrate, wherein the drilled layer has a code region and an alignment mark region surrounding the code region, the through holes are located in the code region, and the drilled layer further comprises an alignment mark located in the alignment mark region, wherein the mark structure further comprises a shielding layer, and the shielding layer is overlapped with the through holes and the alignment mark in the normal direction of the surface of the substrate.

2. The display panel according to claim 1, wherein the shielding layer is overlapped with and separated from the drilled layer.

3. The display panel according to claim 1, wherein the shielding layer overlaps and contacts the drilled layer.

4. The display panel according to claim 1, wherein the mark region is overlapped with the active element region.

5. The display panel according to claim 1, wherein the mark region is separated from the active element region.

6. The display panel according to claim 1, wherein the active elements comprise a dual-gate thin film transistor, and a bottom gate of the dual-gate thin film transistor and the drilled layer belong to one film layer.

7. The display panel according to claim 6, wherein a portion of the shielding layer is overlapped with the drilled layer in the normal direction of the surface of the substrate, and a top gate of the dual-gate thin film transistor and the shielding layer belong to one film layer.

8. A display panel, comprising:
   a substrate;
   a mark structure, disposed in a mark region of the display panel, wherein the mark structure comprises a drilled layer, and the drilled layer has a plurality of through holes;
   a plurality of active elements, disposed in an active element region of the display panel, wherein both the mark region and the active element region are located in a display region of the display panel;
   a plurality of light emitting elements, disposed in the display region of the display panel, wherein a first portion of the light emitting elements is overlapped with the mark structure in a normal direction of a surface of the substrate; and
   a circuit structure, electrically connected to the first portion of the light emitting elements, wherein a portion of the circuit structure is overlapped with the mark structure in the normal direction of the surface of the substrate, wherein the drilled layer comprises a planar portion and a plurality of uplifted portions, and the uplifted portions surround the through holes, wherein the circuit structure comprises a signal line, and a portion of the signal line is overlapped with the uplifted portions in the normal direction of the surface of the substrate.

9. The display panel according to claim 8, wherein a thickness of the planar portion of the drilled layer is less than $\frac{1}{7}$ a thickness of the signal line.

10. A display panel, comprising:
    a substrate;
    a mark structure, disposed in a mark region of the display panel, wherein the mark structure comprises a drilled layer, and the drilled layer has a plurality of through holes;
    a plurality of active elements, disposed in an active element region of the display panel, wherein both the mark region and the active element region are located in a display region of the display panel;
    a plurality of light emitting elements, disposed in the display region of the display panel, wherein a first portion of the light emitting elements is overlapped with the mark structure in a normal direction of a surface of the substrate; and
    a common electrode, electrically connected to the light emitting elements and extending into the mark region from the active element region.

* * * * *